United States Patent [19]

Fuchigami

[11] Patent Number: 5,470,247
[45] Date of Patent: Nov. 28, 1995

[54] BURN-IN SOCKET APPARATUS

[75] Inventor: Masahiro Fuchigami, Gotenba, Japan

[73] Assignee: Texas Instruments Incorporated, Dallas, Tex.

[21] Appl. No.: 225,484

[22] Filed: Apr. 8, 1994

[30] Foreign Application Priority Data

Apr. 24, 1993 [JP] Japan .................................. 5-159918

[51] Int. Cl.⁶ .................................................. H01R 13/15
[52] U.S. Cl. .......................................... 439/264; 439/331
[58] Field of Search .................... 439/70–73, 263–266, 439/268, 330, 331, 525, 526

[56] References Cited

U.S. PATENT DOCUMENTS

| 4,846,704 | 7/1989 | Ikeya . | |
|---|---|---|---|
| 5,020,998 | 6/1991 | Ikeya et al. . | |
| 5,076,798 | 12/1991 | Uratsuji . | |
| 5,228,866 | 7/1993 | Espenshade et al. | 439/266 |
| 5,318,456 | 6/1994 | Mori | 439/266 |

FOREIGN PATENT DOCUMENTS

0457472A1  11/1991  European Pat. Off. .

Primary Examiner—Khiem Nguyen
Attorney, Agent, or Firm—Russell E. Baumann; Richard L. Donaldson; Reneé E. Grossman

[57] ABSTRACT

A burn-in socket is shown including a latch member (60) capable of moving leads (101) of an IC package (100) received on a seat (200) on a base member (20), biasing the leads into engagement with movable contact arms (212) of contacts (21) mounted in the base member. A linking mechanism (50), movable in dependence upon the vertical movement of a cover member (30), transmits the cover member movement to latch member (60). Linking mechanism (50) has an arm (52) pivotably connected at one end to the cover member (30) and at an opposite end to a lever body (54) intermediate opposite ends thereof. The lever body has one end pivotably connected to base member (20) and its opposite end connected to latch member (60). A return spring (40) places a bias on the cover to maintain it normally separated from the base member and provides a selected contact force. The socket can be used with a wide variety of IC package types either before or after leads extending from the IC package have been formed.

18 Claims, 5 Drawing Sheets

BURN-IN SOCKET APPARATUS

BACKGROUND OF THE INVENTION

FIELD OF THE INVENTION

This invention relates generally to integrated circuit (IC) packages and more particularly to a socket for use with testing IC packages.

In conducting a heat-resistance test of an IC package, called a burn-in test, it has been customary to place the IC package in a socket, in turn connected to a circuit substrate, such as a printed substrate, and then to place the substrate into a heating furnace to conduct the test to thereby determine whether or not the product is satisfactory.

Sockets for use in such IC package tests are known having the structures shown in FIGS. 1 and 2. The socket shown in FIG. 1 has a vertically movable cover 3 in which the IC package is inserted or removed by pushing down the cover. A plurality of contacts 4 having a prescribed pitch are mounted around the position of the base block 1 where the IC package is set. A connecting terminal 4b extends downwardly from a main body 4a. A support spring 4c extends upwardly and outwardly from each main body in a curved fashion approximately in the form of a U. One leg, attached to each main body, extends toward the base block while the other leg extends away from the base block and at its free end has a contact arm 4d extending back into the base block 1 and a lever part 4e which extends upwardly from the free end of the support spring 4c.

The distal free end of each lever 4e is pressed against the surface of a guide groove 3a which is formed on the lower surface of cover 3. When cover 3 is pressed down or push up, the distal end of each lever 4e is moved in dependence upon the moving inclined surface 3b of guide groove 3a.

In the construction shown in FIG. 1, if cover 3 is pressed down in opposition to springs 4c, lever parts 4e of contacts 4 are guided by the inclined surface 3b of guide groove 3a and move outwardly with the base part of the respective spring piece 4c as the fulcrum. Along with this, contact arms 4d rotate outwardly with the respective end of the spring piece 4c as the fulcrum, thereby moving away from the seat position of a lead of an IC package.

Thereafter, the main body 100 of an IC package is placed on the seat portion 1a of base block 1 and the downward force on the cover 3 is removed. As a result of this, the lever parts 4e of contacts 4 move and return inwardly as they are guided by the movable inclined surface 3b of the guide groove 3a. Concomitantly, the movable contacts 4d rotatably return inwardly, with their distal tip parts being biased into engagement with a respective tip of an IC lead 101 that has been placed on the seat position 1a from above. The compressive contact force applied to the IC leads is based on the spring force of the spring pieces 4c. In this manner, the IC package is installed in the socket.

When the IC package is to be removed from the socket, cover 3 is pressed down as in the previous case, the movable arms 4d of contacts 4 rotate outwardly and, after their distal tip parts separate and move outwardly from IC leads 101, the IC package is removed from the seat position 1a and downward force on cover 3 is then removed.

Regarding the socket shown in FIG. 2, on the other hand, the cover is rotatable toward and away from the base block with the cover being held in the closed state by a latch. As a consequence, the leads of the IC package that had been placed on the seat position of the base block are biased and engaged by respective contact parts of the contacts mounted on the base block of the socket.

In FIG. 2, a shaft 8 extends through a hinge part 5a formed at one end of base block 5 and a hinge part 6a formed on the base side of a cover 6 so that cover 6 is rotatable about the shaft in the direction of opening or closing the top of base block 5. A holding piece 6b is formed on the inner surface of cover 6 projecting along each of the four sides for holding each lead 101 of the IC package. Cover 6 is biased at all times in the opening direction by means of a spring 8 mounted on shaft 7.

A latch 10 is pivotably mounted on shaft 9 mounted on a side of cover 6 opposite hinge part 6a. A spring 11, provided on shaft 9, biases latch 10 at all times in the direction where base block 5 would be engaged with a step part 5c of base block 5.

The central portion 5d of the base block 5 is generally in the shape of a rectangular frame and a plurality of contacts 12, corresponding to the leads 101 of the IC package, are disposed around the periphery of the central portion. Terminal 12a of each contact 12 extends below the base block 5 to be connected to a circuit pattern of the circuit substrate (not shown in drawings) by means of insertion or soldering.

In the above described structure, after each lead 101 of the IC package is placed on a corresponding contact 12 with the leads 101 being positioned by boss parts 5e provided at four locations on the upper surface of base block 5, cover 6 is rotated around shaft 7 closing the top of the base block. As a result, a holding piece 6b of cover 6 engages each lead 101 of the IC package.

When cover 6 is further pressed, hook part 10a of latch 10 becomes engaged with step portion 5c of base block 5 fixing the cover to base block 5 in a closed state. Contacts 12 are pushed down along with leads 101 of the IC package by holding pieces 6b of cover 6 and engage leads 101 under a desired contact force because of the counter-force of the contacts, with a result that a satisfactory electrically conductive path is obtained.

After a heat resistance test of the IC package has been completed latch 10 is pivoted so that hook part 10a is disengaged from step portion 5c of base block 5 and cover 6 then rotates and returns to the open state by the spring force of spring 7 allowing removal of the IC package from base block 5.

The socket of the vertically movable cover type as shown in FIG. 1 has the following problems in spite of its advantage of being conducive to automating the mounting and removal of IC packages:

(1) There is a need to engage a respective IC lead 101 at a locus which is extremely close to the main body 100 of the IC package in order to minimize such problems as electrical loss, etc. However, the rotary movement of the contact arm 4d makes it difficult to have the tip of the movable contact 4d engage lead 101 at a position which is close to the main body 100 when the IC package is of the type shown in FIGS. 3 and 4 in which the leads extend straight out from the main body prior to forming and cutting of the leads, or at a location which is spaced from the tip of lead 101. Thus, even if it were applicable to the IC package in which leads 101 have been formed, as a general rule it is not useful with IC packages in which the leads 101 extend out in a straight line from the main body 100.

(2) In the case of a socket of the vertically movable cover type according to the prior art, the route of the electric current is longer than desirable because of the structure of contact 4, with a consequence that the inductance of the circuit becomes greater thereby promoting cross talk between adjacent contacts and thus creating a problem of not being able to cope with the narrower pitch of the IC leads 101 used in more recent years.

Meanwhile, even though the prior art sockets of the rotating cover, as shown in FIG. 2, have the advantage of solving the above noted problems of the vertically movable cover type, its construction is not conducive to automation because of the rotational movement of the cover thereby bringing about a disadvantage in that IC package mounting and removal cannot easily be automated.

SUMMARY OF THE INVENTION

It is an object of the present invention to provide a socket which overcomes the prior art problems described above. Another object of the invention is the provision of a test socket of the vertically movable cover type which can be widely applied to IC packages of the type in which the leads extend from the main body irrespective of whether the test is conducted before or after the forming of the IC leads and being capable of being biased against and engaged with the contacts of the socket without any hindrance even at a point which is close to the base end of the IC leads. Yet another object is the provision of a socket requiring a low operating force yet one which at the same time has high contact forces, and further, one which is capable of accurately maintaining the contact force between the contacts and the IC leads.

In accordance with the invention, a latch member is provided which is capable of moving the leads of an IC package in the direction of biasing and engaging the leads of the IC package with the movable contact arms of the socket in dependence upon the vertical movement of the cover member at the top of the base member. A motion transfer mechanism transmits the vertical movement of the cover member to the latch member and moves the latch member in a direction to bias and engage the IC leads as well as in the direction away from biasing and engaging the leads.

Further, according to a feature of the invention, the movable contact arm of each contact extends in a generally straight line inclined from the main body of the contact so that the distal free end of its extension reaches the bottom surface of a respective lead of the IC package that has been placed on the base member and the latch is pressed toward the free distal end of the extension of the movable contact arm of each contact through the IC lead.

In addition, the invention provides a position regulating member whereby the cover member is engaged and normally held at a prescribed location away from the base member by a return spring. The spring force is applied to the latch member in the bias and engagement direction in connection with the biasing and engaging of each IC lead with the movable contact arm of the corresponding contact through the latch member.

According to another feature of the invention, the motion transfer mechanism comprises a linking mechanism including an arm having a first end pivotably connected to the cover member and a second end pivotably connected to an intermediate portion of a lever body. A first end of the lever body is pivotably connected to the base member and the second end of the lever body is connected to the latch member. In this manner, the force used to move the cover member is increased at a prescribed ratio through the linking mechanism to be transmitted to the latch member.

According to yet another feature of the invention, the latch member engages each lead of the IC package on the base member in dependence upon the upward movement of the cover member and in connection with the upward return of the cover member by the spring force of the spring, the latch member is moved further downwardly by a prescribed amount from the position of initial engagement so that each lead may be biased against and engaged with the distal free end of the movable contact arm of the corresponding contact with a selected contact force because of this further movement.

According to the invention, a counter force to counter the further movement is produced in each movable contact arm by the further movement of the latch member in opposition to the force applied through the latch member.

According to another feature of the invention, the position of the pivoting point of the linking mechanism's arm connected to the cover member with the cover member located at a prescribed location when the latch member first engages the leads is expressed by C', the position of the same pivoting point when the cover member has moved upwardly and returned to its upper most position is expressed by C, the position of the distal free end of the movable contact arm when the latch member has initially engaged the IC leads by the upward movement of the cover member to the prescribed location is expressed by A' and the position of the distal free end of the movable contact arm when the latch member has been further depressed by the upward movement and return of the cover member to its upper most position is expressed by A, the ratio between the amount of the movement CC' of the cover member and the amount of the movement of the latch member AA' is selected having the following relationship:

$$CC' >> AA'$$

With the pivotal point center at one end of the lever body of the link mechanism expressed by 0, the various dimensional relationships among 0A, 0B, 0C and BC are selected so that the push-in force of the latch member depressing the movable contact arms is significantly larger than the operating force of the cover member.

In accordance with yet another feature of the invention, in connection with the further movement of the latch member to the position where the IC leads are biased and engaged with the movable contact arms of the contacts in dependence upon the upward return movement of the cover member, the structural arrangement of the various members of the link mechanism and their dimensional relationships are selected so that the central line connecting the pivotal point center C of the first end of the linking mechanism arm and the pivotal point center B of the second end of the arm becomes parallel with the seating surface of the base member and moreover, the counter force in the direction of the pivotal point center C applied from the distal free end of the movable contact arm of each contact due to the further movement of the latch member to the pivotal point center B becomes equal to the force from the pivotal point center C.

The latch member moves in a direction of engaging the leads of the IC package that have been arranged on the base member through a motion transfer mechanism along with the upward vertical movement of the cover member. Meanwhile, the distal free end of the extension of the movable contact arm of each contact is positioned below a respective lead of the IC package that has been seated as described earlier. Thus, the latch member is pushed against the IC leads and in turn the distal ends of the extension of the movable contact arms by the upward return movement of the cover member. Because of the counter force of this push-down, the IC leads press and engage the distal end of the extension of the movable contact arms under a desired contact force.

If the distal free ends of the extension of the movable contact arms of the contacts are placed at a desired location below the IC lead, such as the base or an intermediate part on the side of the main body of the IC package, to cite an example, the latch member is moved from above and beyond the IC leads to engage the IC leads immediately above the ends of the extension of the movable contact arms and the position and movement of the latch member are set in such a fashion as to push down the end of the extension of the movable contact arms along with the IC leads and the movable contact arms can be biased and engaged with each other at a desired location close to the main body and away from the distal tip surfaces of the IC leads.

Further, because the movable contact arm of each contact extends in a straight line from the main body to a position aligned with and below a respective IC lead, the route of the electric current from the IC lead to the main body of the contact becomes markedly short compared with the prior art vertically movable cover type described above.

In view of the fact that when the IC leads are biased against and engaged with the distal end of the extension of the movable contact arm of the corresponding contact by the movement of the latch member, the spring force has moved the cover member upwardly and there is produced a counter force from the movable contact arms by the press-in of the latch member and, even though the counter force acts on the latch member, it will be cancelled by the spring force from the return spring, thereby preventing separation of the latch member from the IC lead by the counter force.

Moreover, the pivotal point of the arm of the linking mechanism and the pivotal point of the lever body are located laterally beyond the free distal ends of the extension of the movable contact arms of the contacts and beyond the distal tip surfaces of the IC leads and the latch member moves from a point beyond and above the interior and presses down onto or moves up away from the IC leads and distal ends of the movable contact arms. This arrangement allows the socket to be useful with a wide variety of IC packages where the leads project out of the periphery of the main body, such as QFP and other similar devices. Further, as mentioned above, the force transmitted to the latch member from the press-down and push-up force of the cover member can be changed as desired by appropriate selection of the linking mechanism components.

In other words, in view of the fact that the ratio between AA' and CC' is selected in such a fashion that the amount of movement CC' between the position where the latch member engages the IC leads and the continued upward return movement of the cover body and the amount of movement AA' required for the latch member to be further moved or pushed down and biased against and engaged with the free distal ends of the movable contact arms of the contacts assumes the relationship of CC'>>AA', it is possible to increase the depressing force of the latch member compared to the push-up force that is required for the upward return movement of the cover body in conformity with that ratio. The distal free ends of the movable contact arms of the contacts are pressed downwardly by this increased depressing force and are biased against and engaged with the IC leads by the counter force so that it is possible to increase the contact force of each movable contact arm as desired.

Since the central line connecting the pivotal point center C at the first end of the arm of the linking mechanism and the pivotal point center B of the second end assumes a state of being parallel with the seating surface of the base member when the IC leads and the movable contact arms of the contacts are biased against and engaged with each other by the further movement of the latch member, the direction of the force created at that time when the counter force (push-back force) produced by the press-in of the ends of the movable contact arms has been added to the linkage arm moves in the direction of the pivotal point center C of the first end from the pivotal point center B of the second end, with a result that a force which is equal to that force is produced in the direction of the pivotal pointer center B from the pivotal point center C, with the two forces cancelling each other.

Accordingly, the latch member will not be pushed back by the counter force coming from the ends of the movable contact arms and it will be held in the state of being pushed into the IC leads and the distal free ends of the movable contact arms. In other words, the IC leads and the free distal ends of the movable contact arms of the contacts are held in the state of being biased against and engaged with each other by a contact force which is sufficiently large. In addition, this contact force is maintained during the entire period the IC package is mounted in the socket.

DESCRIPTION OF THE PREFERRED EMBODIMENTS

Figure 5:
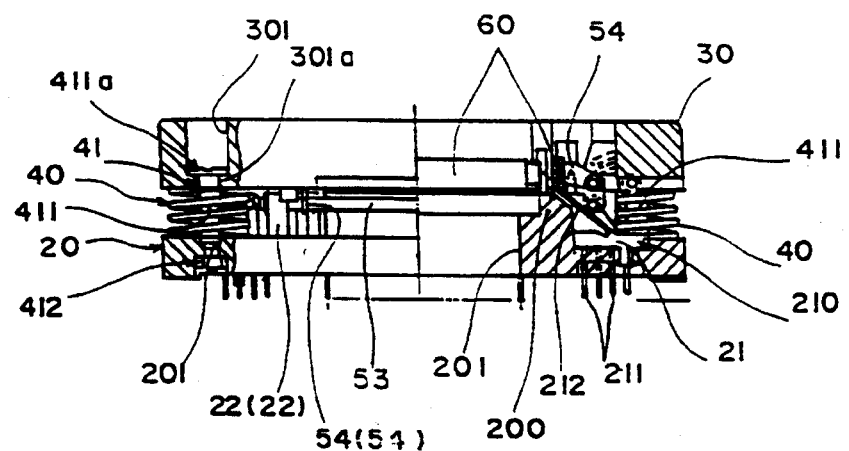
FIG. 5 is a front elevational view of a socket made according to the invention, partly in cross section and with a portion of a latch member broken away.
Figure 6:
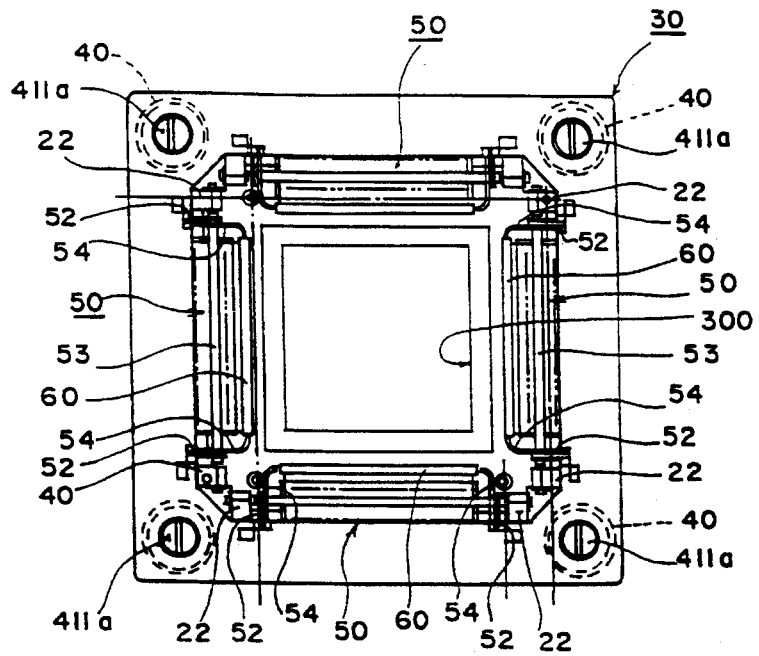
FIG. 6 is a top plan view of the FIG. 5 socket.
Figure 7:
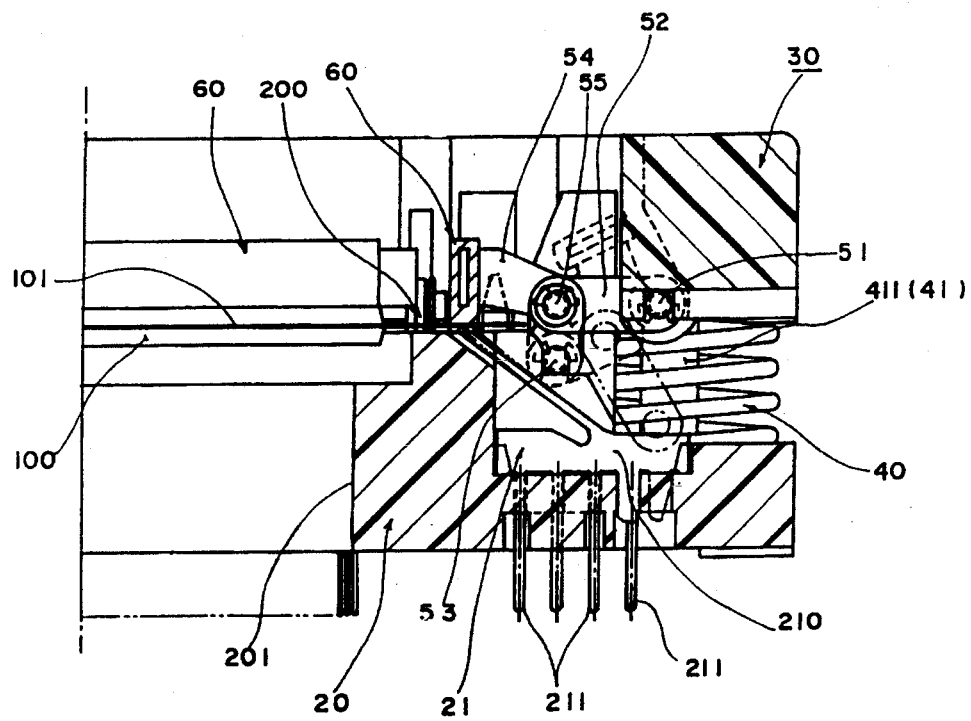
FIG. 7 is an enlarged cross sectional view of the right half of the FIGS. 5, 6 socket.

FIGS. 5 through 7 show a test socket of the vertically movable cover type made according to the invention. This socket comprises a base member 20, a plurality of contacts 21 made of an electrically conductive material mounted along each side of the base member 20 having an array corresponding to the leads 101 that extend from the main body 100 of the IC package, a cover member 30 which has been provided in such a manner as to be movable vertically toward and away from base member 20, a spring 40 at each of the four corners between base member 20 and cover member 30 mounted in such a way as to bias cover member 30 away from body member 20 or in the upward direction at all times and motion transmitting mechanisms 50 which are placed at four locations around the seating position of the IC package disposed at the center 200 of base member 20 and which have been arranged beyond the seating location.

Base member 20 and cover member 30 are preferably molded of resinous material. The center 200 of the base member has an opening 201 at the top and at the bottom in the shape of a rectangle. The IC package is adapted to be placed above center 200. A rectangular opening extends through cover member 30 from top to bottom to allow insertion of the IC package into or removal of the package from the top of the center 200 of the base member.

Contact element 21 is formed integrally of a main body 210 that is mounted in the base member 20, a lead terminal 211 that extends downwardly from the main body 210, and a movable contact arm 212 that projects as an extension generally in a straight line at an inclined angle above the main body 210. Lead terminal 211 extends downwardly below base member 20 to be inserted into a printed substrate (not shown in the drawings) and is connected, by means of soldering or the like, to a circuit pattern (not shown in the drawings).

A movable contact arm 212 extends in the direction of center 200 of base member 20 from the center of the top of main body 210. The distal free end portion of the extension is located at a position to enable it to be in engagement with the bottom surface of the intermediate part of a corresponding lead 101 of the IC package placed above central part 200.

A position regulating member 41 is disposed at each of the four corners of base member 20 and cover member 30 to regulate the position of cover member 30 at a preselected location (the position of the upper most return movement). Position regulating member 41 comprises a screw 411 and a nut 412. Screw 411 is inserted from above into an installation opening 301 that is formed at each of the four corners of the cover member 30 and is received in opening 201 formed at each of the four corners of the base member through a respective spring 4. Nut 412 is placed on each screw from below the base member to fix the cover member to the base member. Each installation opening 301 of cover member 30 has an expanded diameter and step part 301a is formed at the bottom of the expanded diameter part for engagement by head 411a of screw 411. Cover member 30 is limited in an upward moving direction by head 411a of screw 411 at step part 301a of installation hole 301 in connection with the upward return movement due to the return force of spring 40.

Springs 40 in the form of coil springs are return springs for upwardly returning cover member 30 from its pushed down or bottom most position. Springs 40 are compressed by a prescribed amount in the upward returned state of cover member 30. Because of this compression, a force of a prescribed amount is stored in the springs. This force serves as a holding force for holding latch member 60 at its pushed down position when the IC leads 101 and movable contact arms 212 have been depressed.

Cover member 30 is pressed down until it engages the upper surface of base member 20 in opposition to the force of springs 40. When the press down force is released the cover member moves upwardly in a return movement to the preselected position above the base member 20, that is to a position which has been regulated by the position regulating member 41.

The press down of the cover member 30 can be carried out manually or it can be carried out automatically by the action of the handling mechanism of an automatic mounting device.

Motion transfer mechanism 50 can be constructed in the form of a linking mechanism in the manner described below. It is preferred that a separate linking mechanism be provided along each of the four sides of center 200 around the main body 100 of an IC package received at center 200 along with the array of contacts 21.

Linking mechanism 50 comprises a pair of arms 52 with a first respective end being pivotably mounted on a shaft 51 attached to opposite ends of a side of the inside of cover member 30 and a second respective end being pivotably connected to an intermediate portion of a respective one of a pair of lever bodies 54 through pins 55. One end of each lever body 54 is pivotally attached to a shaft 53 supported by portions 22 of base member 20 and a latch member 60 is attached at the second ends of lever bodies 54. Lever bodies 54 are generally L-shaped so that a part extending from the first end to the intermediate part extends generally vertically while the part extending from the intermediate part to the second end is generally parallel with the seating surface of the base member 20 and extends to the seating position of the IC package or in the direction of the central part 200. Latch member 60 is made of suitable material, such as stainless steel, with its surface being coated with an electrically insulating resin and is positioned so that its longitudinal direction extends along the direction of the arrangement of contacts 21. The lower surface of latch member 60 that comes into engagement with the IC leads 101 is formed as a convex curved surface with its body effecting a line contact with the IC leads in such a manner as to depress the free distal ends of the movable contact arms 212 of the contacts 21 through the IC leads 101. It will be appreciated that, if desired, the latch member 60 could be formed integrally with the lever bodies 54.

The first end of each arm 52 attached to cover member 30 moves up and down with cover body 30. The second end of each arm 52 moves in the shape of an arc between the inside surface of cover body member 30 and a position adjacent to the IC leads seating surface around the shaft 53 where one end of the lever 54 has been pivoted in dependence upon the moving action of the first end of arm 52 and cover member 30. In other words, the arms 52 carry out a swaying movement in the upward and downward directions, while the first ends thereof are being regulated by the cover member 30 and the second ends thereof are being regulated by the intermediate part of the lever bodies 54.

In dependence upon the movement of each arm 52, each lever body 54 rotates away from the IC package seat around shaft 53 at one end or toward the IC package seat. Because of these actions, the area of the seating position of the IC leads 101 at the center 200 of the base member are opened upwardly or closed by the link mechanism 50 and the latch member 60.

Along with the rotary action of the lever bodies 54 of the linking mechanism 50, the latch member 60 moves in the upwardly and outwardly direction from the position where the IC leads 101 and the movable contact arms 212 have been pushed down, thereby opening the top of the seating position of the IC package. The latch member 60 comes back into engagement with the IC leads 101 along with the rotary return of the lever body 54 thereby being returned to the position where the leads 101 and the movable contact arms 212 are depressed.

Figure 8:
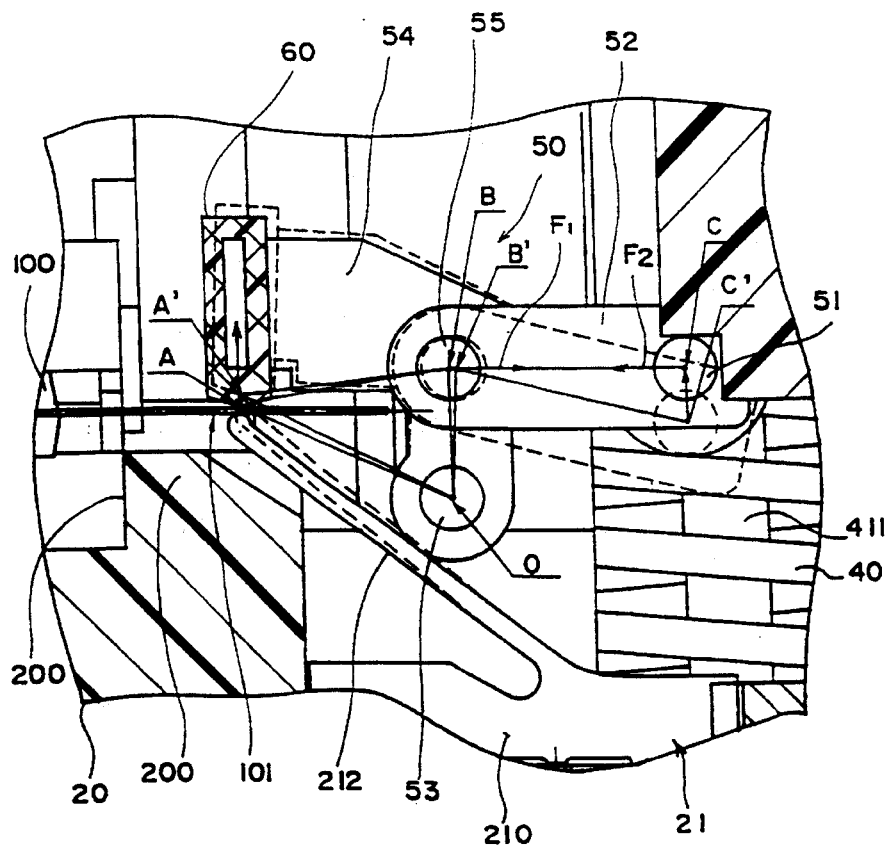
FIG. 8 is an enlarged cross sectional view of the operating mechanism shown for the purpose of explaining the principle governing the operation of a socket made according to the invention.
Figure 9:
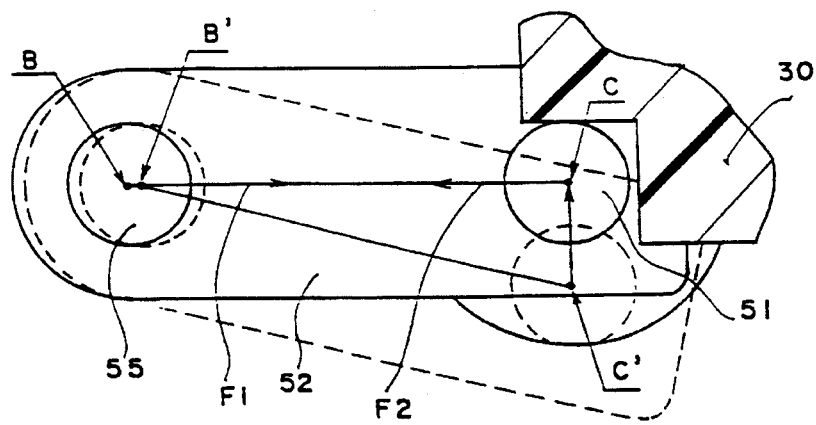
FIG. 9 is an enlarged view of a portion of FIG. 8.

FIGS. 8 and 9 show the principle governing the action of the test socket made according to the invention. The IC package that has been inserted through the opening 300 of the cover member 30 is placed on the center of the base member 20 and leads 101 around the main body 100 are positioned and placed on the distal free end portions of respective movable contact arms 212 of contacts 21. When the cover member 30 moves upwardly from the depressed state to the prescribed location, latch member 60 moves toward the distal free end portions of the movable contact arms 212 in dependence upon the action of the link mechanism 50 as shown by a broken line in FIG. 8, thereby causing the bottom of the lower surface to effect a line contact with the IC leads 101 that have been placed on the distal free end portions of the movable contact arms 212.

The pivotal point center at the first end of each lever body 54 is expressed by 0, the position of initial engagement between the bottom of the latch member 60 and an IC lead 101 is expressed by A', the position of the pivotal point center at the second end of each arm 52 connected to the intermediate part of a respective lever body 54 is expressed by B' when the latch member initially engages the IC lead and the corresponding position of the pivotal point center at the first end of each arm 52 is expressed by C'.

When the bottom of the latch member 60 makes a downward return movement from the position where it first engages IC leads 101 to the position which has been regulated by the position regulating member 41, arms 52 and the lever bodies 54 move from the position indicated by a broken in FIG. 8 to the position indicated by a solid line. Because of this action, the latch member 60 is depressed by the amount of the movement from point A' to point A as shown by the solid line in FIG. 8. Because of this further movement, the movable contact arms 212 of contacts 21 are pressed down by the AA' portion of the latch member movement along with the IC leads 101 and, because of the counter force to the further movement each IC lead 101 is biased against and engaged with the movable contact arm 212 of the corresponding contact 21.

Each lead 101 and respective movable contact arm 212 of a contact 21 is electrically connected, maintaining a satisfactory electrical path by the contact force that has been produced by the counter force of the push-down. The engagement point between the bottom of the latch member 60 and the IC leads 101 when the IC leads 101 and the movable contacts 212 are pressed down and engaged as shown by a solid line in FIG. 8 is expressed by A and the corresponding portions of the pivotal points at the first and second ends of arms 52 are expressed by C and B, respectively as shown in FIG. 9.

The linking mechanism 50 increases the force received by cover member 30 by a prescribed ratio, thereby making it possible to transmit the increased force to the latch member 60. In other words, the amount of movement AA' when IC leads 101 and movable contact arms 212 have been pushed down from the position A' where the bottom of the latch member 60 initially engages IC leads 101 to the position A and the amount of the movement CC' when the cover member 30 has moved upwardly from the position where the latch member 60 first engages the IC leads 101 have a relationship of AA'<<CC'. The amount of the movement CC' is significantly larger compared to the amount of the movement AA' and the force on the cover member 30 is increased at a ratio between AA' and CC' determined by the lengths of the components of the linking mechanism and transmitted to latch member 60.

Accordingly, a small operating force on cover member 30 is transmitted as a large actuation force on latch member 60. Because of the counter force of the downward actuation force, the movable contact arm 212 of the contact 21 and each IC lead 101 is biased against and engaged under a sufficiently large contact force.

The force required to press-down IC leads 101 and movable contact arms 212 from position A' to position A where the necessary contact force is obtained through the latch member 60 is provided by the spring force of springs 40. In accordance with the invention, the spring force of springs 40 can be reduced to a minimum. Accordingly, due to the linking mechanism it becomes possible to reduce the force required for the cover body 30 to be pressed down.

As stated above, the ratio between the amount of movement AA' and the amount of movement CC' or the ratio for the conversion of the force that is obtained by the link mechanism 50 can be adjusted to the optimum value by selecting and setting the lengths of OA, OB, OC and AB and BC at the desired values.

When latch member 60 has been depressed from A' to A, the spring force that has been stored in springs 40 is added to latch member 60. This spring force works in a direction which opposes the counter force that is produced by the depression of movable contact arms 212.

In addition, the counter force which has been produced in movable contact arms 212 in connection with the biasing and engaging between IC leads 101 and movable contacts 212 by the further downward movement of latch member 60 works vertically upward in the direction of pushing latch member 60 upwardly.

Because of this counter force, further, a force F1 (FIG. 8) in the direction of an upward rotation is added to the pivotal point B at the second end of arm 52. However, in view of the fact that, when IC leads 101 and movable contact arms 212 have been depressed and engaged by the further movement of the latch member 60, the central line connecting the center B of the pivotal point on the second end of arm 52 and the pivotal point center C at the first end thereof is generally parallel with the seating surface of the base member 20, the counter force F1 that has been added to the pivotal point B on the second end of arm 52 works in the direction of the pivotal point center C at the first end in opposition to the force F2 coming from the pivotal point center C at the first end thereby effecting a mutual cancellation.

As a consequence of the above, the counter forces which have been produced from movable contact arms 212 are mutually cancelled. In addition, cover member 30 has such a construction that it may be pushed down only when an external force has been added. Unless there is an external force pushing down cover member 30, link member 50 and latch member 60 are held in a position where the IC leads 101 and the movable contact arms 212 have been pressed down. Accordingly, it becomes possible to accurately hold IC leads 101 and movable contact arms 212 of contacts 21 in a state of being biased against and engaged under a sufficient contact force. Moreover, the contact force of movable contact arms 212 for the IC leads 101 are maintained at the desired level.

Movable contact arms 212 of contacts 21 extend from the main body in a straight line at an inclined angle and their free distal ends are located below the seating position of IC leads 101. The various members of linking mechanism 50 are arranged outwardly beyond the seating position of IC leads 101. Because of the action of link mechanism 50, latch member 60 moves from above and beyond IC leads 101 toward and below the seating position of leads 101 by pressing down movable contact arms 212 together with leads 101. In a reverse course of action, the latch member 60 separates and moves above and beyond IC leads 101.

The position of the distal free ends of the extensions of movable contact arms 212 for engagement with the IC leads and the position of engagement between latch member 60 and the IC leads may be chosen to be closely adjacent to the main body of the IC leads away from the distal tips of the IC leads or at selected location such as an intermediate portion, or the like by modifying the angle at which the contact arms extend, the length, etc., and by selecting the dimensions and shapes of the various members of linking mechanism 50.

Accordingly, the socket can be used with the IC package before the leads have been formed with the IC leads projecting out and in straight line or with the IC package subsequent to said forming, irrespective of the shape of the leads.

Figure 10:
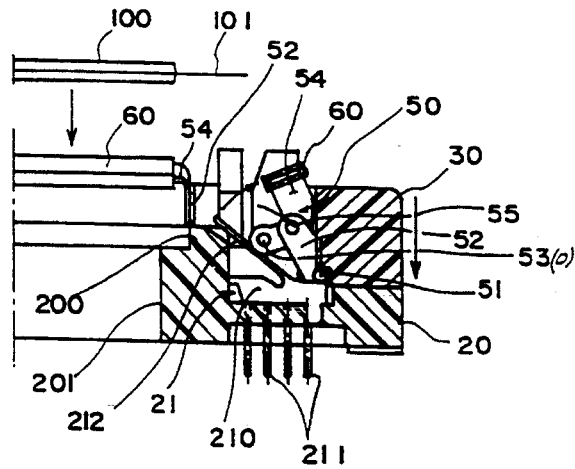
FIG. 10 is a cross sectional view of the right half of the socket shown with the cover member depressed to its lower most position in engagement with the body member and with an IC package about to be inserted.

If cover member 30 is depressed to such an extent as to engage the upper surface of base block 20 as shown in FIG. 10, linking mechanism 50 rotates outwardly about the pivotal point 0 at the first end of lever body 54 as the center. Along with this rotary movement, latch member 60 separates and moves upwardly from the seating position of the IC leads and beyond to a fully separated position as shown in the figure. Because of this, the space at the top of the loading position of the IC package is open. Therefore, the IC package can be inserted onto the seating position through opening 300 of cover member 30 and leads 101 can be placed on the free distal end portions of movable contact arms 212 of contacts 21.

Figure 11:
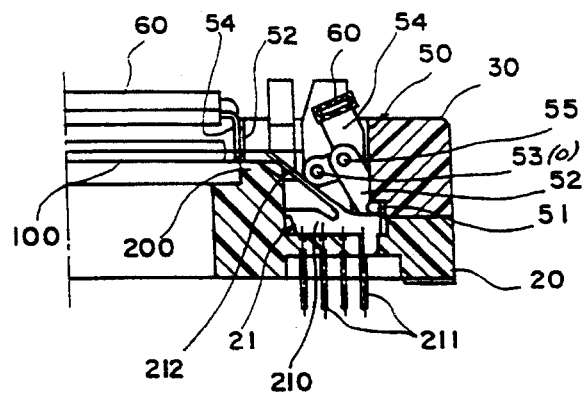
FIG. 11 is a view similar to FIG. 10 shown with the IC package inserted in the socket.
Figure 12:
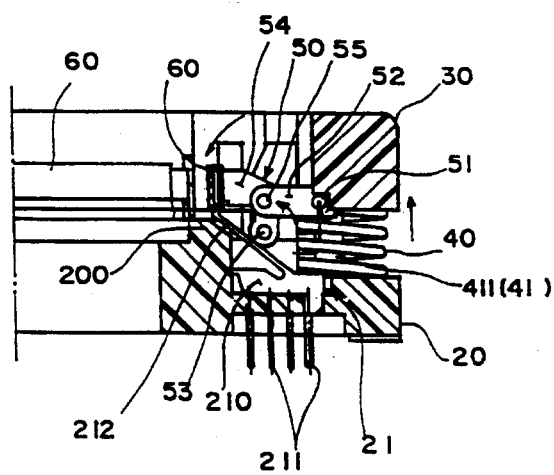
FIG. 12 is a view similar to FIG. 10 but shown with the cover member in its upper position removed from the body member.

When the press-down force on cover member 30 is removed subsequent to seating IC package 100 on the central part 200 of base member 20 as shown in FIG. 11, cover member 30 is automatically pushed upwardly by the return force of springs 40. Concomitantly, linking mechanism 50 rotates inwardly toward the IC leads 101 with the fulcrum 0 at the first end of the lever body 54 as the center. Along with this, latch member 60 moves from the fully separated position in a direction toward a point of engagement with the IC leads 101.

When cover member 30 moves upwardly a portion of its stroke to a prescribed location, linking mechanism 50 rotates to a prescribed position in the direction of IC leads 101 as shown by the dashed line in FIG. 8 and, at the same time, latch member 60 moves toward IC leads 101 and the bottom surface of latch member 60 comes into engagement with the IC leads and, furthermore, the IC leads are biased against the distal end portions of the movable contact arms 212 which are immediately below the IC leads. From this position, the cover member 30 is further pushed upwardly with the link mechanism 50 rotating to the position indicated by the solid line in FIG. 8, with the fulcrum 0 as the center.

Along with this rotary movement, latch member 60 moves further downwardly. Because of this, IC leads 101 and movable contact arms 212 of contacts 21 are depressed a distance which corresponds to the amount of movement AA' and, because of the counter force due to this further downward movement, IC leads 101 and movable contact arms 212 are biased against and engaged with sufficient contact force, thereby effecting a suitable electrical path.

In this manner, the IC package is mounted on the socket as shown in FIG. 8 and a test of the IC package is then conducted.

In connection with the removal of the IC package from the test socket subsequent to the completion of the test of the IC package, if cover member 30 is pressed down in the same manner as described above, a state shown in FIG. 11 is obtained and the top of the seating position of the IC package is opened by an action which is the same as the one described above, with a result that it becomes possible for the IC package to be taken out. In this manner, the IC package can be removed from the socket at the completion of the test using an IC carrying head (not shown).

Figure 1:
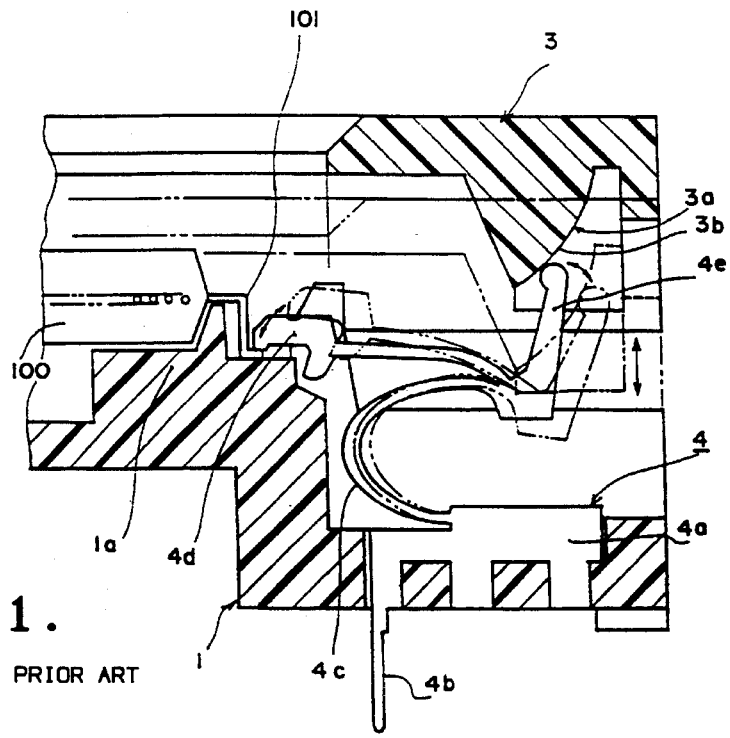
FIG. 1 is a cross sectional view of a portion of a socket of the vertically movable cover type according to the prior art.
Figure 2:
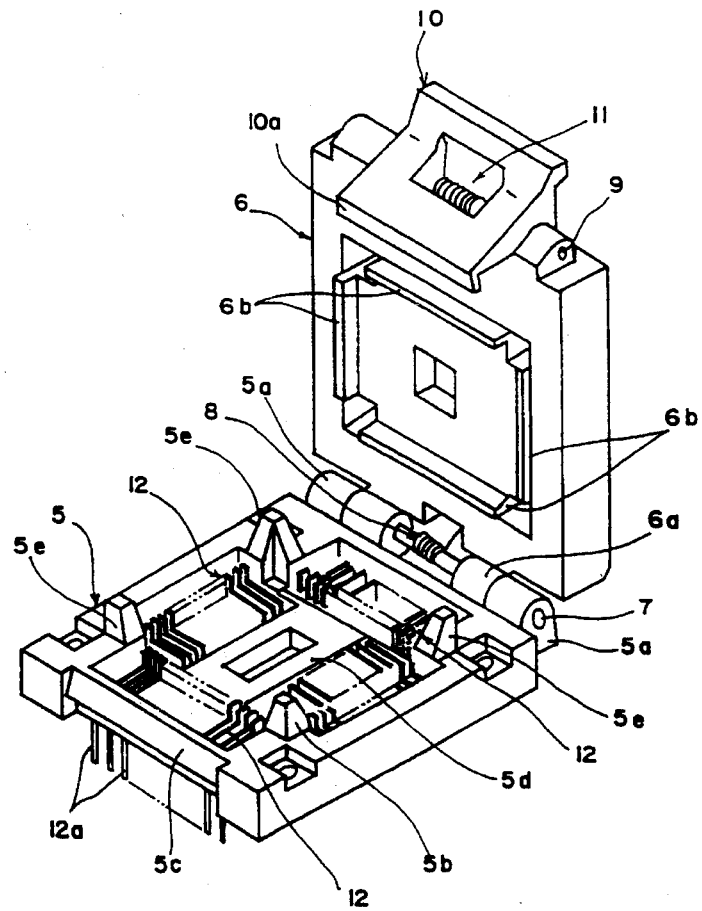
FIG. 2 is a perspective view of a socket of the rotatable cover type according to the prior art.
Figure 3:
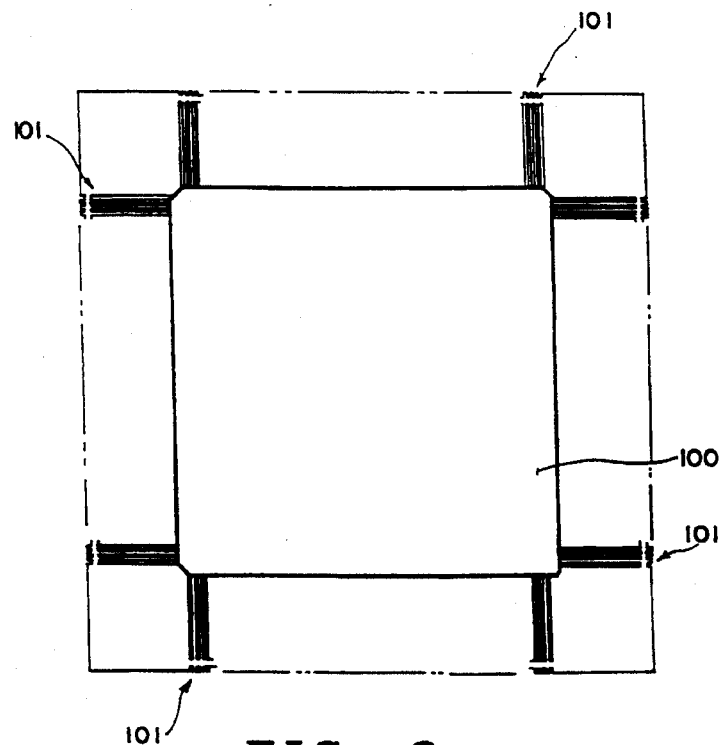
FIG. 3 is a top plan view of an IC package which can be tested in a socket made according to the invention.
Figure 4:
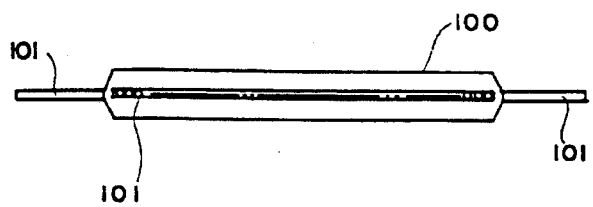
FIG. 4 is a front elevational view of the FIG. 3 IC package.

It will be appreciated that sockets for testing made in accordance with the invention can be widely used not only with the QFP type shown in FIGS. 3 and 4 but also with various other kinds of IC packages in which leads extend from the main body as well as in an IC where the IC chip has been mounted on a carrier, by way of example.

According to the invention, the following effects can be obtained as is clear from the explanation given above.

Irrespective of the shape of the leads, the IC package can be mounted and removed before or after forming of the leads. The invention offers a test socket of the vertically movable cover type which can be widely used in the testing of IC packages of the type where the leads extend out of the main body.

In a socket of the vertically movable cover type, it becomes possible to cancel the counter force and the hold-back force that are produced by the depression of the contacts, and the IC leads and the movable contact arms of the contacts can be accurately maintained in a state of engagement under a desired contact force. Accordingly, the reliability of the contact connection between the IC leads and the contacts can be improved.

In a socket of the vertically movable cover type, it becomes possible to minimize the spring force of the return spring that restores the cover body, exerting a sufficiently large force on the IC leads and the movable contact arms of the contacts by the small spring force, thereby accurately pushing down the movable contact arms to the desired position and producing the necessary contact force.

Accordingly, a sufficiently large contact force can be obtained by using a low operating force and the IC leads can be firmly connected to the contacts.

It should be noted that it is better for the spring constant of the spring to be as small as possible. In other words, it is desirable for the spring force to be either equal to or larger than the counter force of the movable contact arms of the contacts but not larger than necessary.

The movable contact arms of the contacts extend at an inclined angle from the main body, with the lower surface of the IC leads being engaged with the distal free ends of the extensions. Therefore, it becomes possible to electrically connect the IC leads and the main body of the contacts at the shortest distance from each other, with a result that the route of the electric current that flows to the contacts becomes shorter and that the ever increasingly narrow pitch of the IC leads being used currently can be satisfactorily dealt with.

Since, moreover, the distance covered by the movable contact arms of the contacts by the movement of the latch member is small and the contact force with the IC leads can be obtained in a sufficiently large quantity by using a minimal amount of movement, the life of the contacts can be increased and this leads to an increased life for the socket.

Moreover, the shape of the movable contact arms of the contact is simple, with a consequence that the structure of the contact can be simplified accordingly.

In view of the above, it will be seen that the several objects of the invention are achieved and other advantageous results obtained.

As various changes could be made in the above construction and methods without departing from the scope of the invention, it is intended that all matter included in the above description or shown in the accompanying drawings can be interpreted as illustrative not in a limiting sense.

What is claimed:

1. A socket comprising a base member with a plurality of contact elements being mounted around an IC package receiving seat formed on the base member, the contact elements each having a main body and a movable contact arm extending therefrom, a cover member vertically movable toward and away from the base member from a position adjacent to the base member to a position removed from the base member at a fully extended return position, a spring biasing the cover member away from the base member, a latch member capable of moving the leads of an IC package received on the IC package receiving seat in the direction of engaging the movable contact arms of corresponding contact elements in dependence upon the movement of the cover member and a motion transfer mechanism which moves in dependence upon the movement of the cover member, the motion transfer mechanism coupled to the latch member to move the latch member toward and away from the contact arms, said movable contact arms of said contact elements only movable by movement action of said latch member moving said leads of the IC package.

2. A socket according to claim 1 in which the movable contact arm of each contact element extends in a straight line at an angle from the main body to a free distal end with the free distal end adjacent to the bottom of a respective lead of an IC package that has been placed on the base member and the latch member being movable toward the free distal ends of the extension of the movable contact arms through the IC leads.

3. A socket according to claim 1 further including a position regulating member which limits movement of the cover member away from the base member to a preselected position, the spring being under compression when the cover is at the preselected position and applying a force to the cover member in a direction away from the base member, the spring force being also applied to the latch member when each IC lead is biased and engaged with a respective movable contact arm of each contact by the pressing of the latch member.

4. A socket according to claim 1 in which the motion transfer mechanism comprises an arm having opposite ends having one end pivotably connected to the cover member and a lever body having opposite ends having one end pivotably connected to the base member, the other end of the arm pivotably connected to the lever body intermediate its ends and the latch member provided at the other end of the lever body and the operating force of the cover member is increased at a prescribed ratio through the motion transfer mechanism to be transmitted to the latch member.

5. A socket according to claim 1 in which the latch member, in dependence upon movement of the cover member, engages leads of an IC package received on the IC package receiving seat at a prescribed location of the cover member and, when the cover member moves to the fully extended return position from the prescribed location by the spring force of the spring, the latch member is further moved by a prescribed amount from the position of engagement in conformity with the upward return movement with the IC leads being biased and engaged with the distal free ends of the movable contact arms of the corresponding contacts.

6. A socket according to claim 4 in which the position of the pivoting point of the one end of the arm when the cover body has moved upward to a prescribed position when the latch member initially engages the IC leads is expressed by C', the position of the pivoting point of the one end of the arm when the cover member has moved upwardly to its fully extended return position is expressed by C, the position of the latch member at the point of initial engagement with the IC leads is expressed by A' and the position of the point of engagement with the IC leads when the latch member has been further moved by the upward return movement of the cover member to its fully extended return position is expressed by A, the ratio between the amount of movement of the cover member CC' and the amount of further movement of the latch member AA' is selected so that the distance CC' between C' and C assumes the following relationship relative to the distance AA' between A' and A:

$$CC' \gg AA'.$$

7. A socket according to claim 6 wherein a central line connecting pivotal point center C at the one end of the arm of the motion transfer mechanism and the pivotal point center B at the other end of the arm of the motion transfer mechanism is generally parallel with the seating surface of the base member and that the force in the direction of the pivoting point center C from pivoting point center B by the counter force from the movable contact arms of the contacts due to the further movement of the latch and the force from the pivoting point center C opposed to the counter force are equal to each other.

8. A socket according to claim 4 where, when the cover member is in the fully extended return position, the pivoting point of the lever body is expressed by 0, the point of engagement with the IC leads by the latch member mounted at the second end of the lever body is expressed by A, the pivoting point at the second end of the arm attached to the intermediate part of the lever body is expressed by B and the pivoting point of the first end of the arm is expressed by C, the dimensional relationship among the OA, OB, OC and BC is selected at a prescribed value so that the pressing force of the latch member is significantly larger than the operating force required to depress the cover member.

9. Socket apparatus for receiving an integrated circuit package having a plurality of leads extending therefrom comprising a base member having an integrated circuit package receiving seat formed thereon, the base member mounting a plurality of contact elements arranged in a selected array, the contact elements each having a main body portion mounted in the base member, a terminal portion extending downwardly from the body portion to a point below the base member and a movable contact arm extending upwardly toward the integrated circuit package receiving seat, a cover member disposed over the base member and being movable between a position engaging the base member and a position away from the base member, spring means for applying a bias to the cover member urging the cover member away from the base member, a latch member and a linking mechanism coupled to the cover member, the latch member movable toward and away from the movable contact arms, the position of the latch member being dependent upon the position of the cover member, the linking mechanism comprising arm means having a first end pivotably attached to the cover member and a second end, lever means having a first end pivotably attached to the base member and a second end attached to the latch member, the lever means having an intermediate portion attached to the second end of the arm means, the lever means pivoting about the first end of the lever means with the latch member moving toward the movable contact arms as the cover member moves upwardly.

10. A socket apparatus according to claim 9 further including means to limit movement of the cover member away from the base member.

11. A socket apparatus according to claim 9 in which the spring means comprises at least one coil spring disposed between the base member and the cover member and at least one elongated element having a free distal end extending upwardly from the base member, the cover member having an aperture therethrough for each elongated element, an elongated element received in each aperture and a flange formed on the free distal end of each elongated element, the flange having an outer periphery larger than the aperture receiving the elongated element to form a stop surface limiting motion of the cover member away from the base member.

12. A socket apparatus according to claim 9 in which the movable contact arms each has a free distal end portion lying in a plane when the cover member is in its position engaging the base member against the bias of the spring means and the latch member having a lower surface which moves below the plane when the cover member is in its outer position away from the base member.

13. A socket apparatus according to claim 12 in which the distance the lower surface of the latch member moves below the plane is represented by AA' and the distance the cover moves causing the movement of the lower surface of the latch member AA' is represented by CC' with CC'>>AA'.

14. A socket apparatus according to claim 9 in which the integrated circuit package receiving seat has first and second opposite sides and a separate latch member and linking mechanism is provided for each opposite side.

15. A socket apparatus according to claim 9 in which the integrated package receiving seat has first and second opposite sides and front and back opposite sides and a separate latch member and linking mechanism is provided for each first and second, front and back sides.

16. A socket apparatus according to claim 9 in which the movable contact arms extend generally in a straight line upwardly and inwardly from the contact main body portions toward the integrated circuit package receiving seat.

17. A socket apparatus according to claim 9 in which the lever means is generally L shaped.

18. A socket apparatus according to claim 9 in which the arm means comprises first and second arms and the lever means comprises first and second lever bodies.

* * * * *